(12) United States Patent
Murphy et al.

(10) Patent No.: US 10,250,239 B2
(45) Date of Patent: Apr. 2, 2019

(54) MULTI-ZONE LIGHTING SYSTEM AND METHOD INCORPORATING COMPACT RF FEED-THROUGH FILTER FOR MRI SCAN ROOMS

(71) Applicants: Matthew Murphy, Mukwonago, WI (US); Andrew D. Bendtsen, Oak Creek, WI (US)

(72) Inventors: Matthew Murphy, Mukwonago, WI (US); Andrew D. Bendtsen, Oak Creek, WI (US)

(73) Assignee: PDC Facilities, Inc., Hartland, WI (US)

( * ) Notice: Subject to any disclaimer, the term of this patent is extended or adjusted under 35 U.S.C. 154(b) by 0 days.

(21) Appl. No.: 15/938,648

(22) Filed: Mar. 28, 2018

(65) Prior Publication Data

US 2018/0287596 A1    Oct. 4, 2018

Related U.S. Application Data

(60) Provisional application No. 62/478,113, filed on Mar. 29, 2017.

(51) Int. Cl.
| | | |
|---|---|---|
| *H05B 33/08* | (2006.01) | |
| *H03K 5/1252* | (2006.01) | |
| *G01R 33/422* | (2006.01) | |
| *H05B 37/02* | (2006.01) | |
| *G01R 33/28* | (2006.01) | |
| *G01R 33/565* | (2006.01) | |

(52) U.S. Cl.
CPC ......... *H03K 5/1252* (2013.01); *G01R 33/422* (2013.01); *H05B 33/0845* (2013.01); *H05B 37/0263* (2013.01); *G01R 33/283* (2013.01); *G01R 33/5659* (2013.01)

(58) Field of Classification Search
None
See application file for complete search history.

(56) References Cited

U.S. PATENT DOCUMENTS 5,432,544 A *  7/1995  Ziarati ................. G01R 33/283
                                                324/318
7,629,570 B2 * 12/2009  Mondloch ................. F21V 3/04
                                                250/227.11

(Continued)

*Primary Examiner* — Crystal L Hammond
(74) *Attorney, Agent, or Firm* — Joseph S. Heino; Erin E. Kaprelian

(57) ABSTRACT

A filter with five or more electrically isolated inputs filtering EMI is provided for configurable lighting systems in an MRI room. The LED driver can be remote or on board the luminaire. Fixtures with no on-board electronics and Cat5 wiring are also possible given the MZPS characteristics. The embodiment of the filter includes independent, electrically isolated, low voltage, and low current feedthroughs. While the filter housing can take any form, the preferred embodiment is DB (or D-subminiature which contains two or more rows of pins or sockets surrounded by a D-shaped metal shield that, among other things, screens against EMI). Individual feedthrough filters may be paralleled to increase total current required for increase load demand for MRI lighting systems. Further, the use of electrically isolated AC/DC or DC/DC drive electronics, enable the use of a low cost multi-input filter which supplies an MRI scan room with power to drive luminaires.

21 Claims, 2 Drawing Sheets

(56) References Cited

U.S. PATENT DOCUMENTS

| | | | |
|---|---|---|---|
| 9,426,852 B2* | 8/2016 | Zudrell-Koch | H05B 41/3924 |
| 9,635,719 B2* | 4/2017 | Knoedgen | H05B 33/0806 |
| 2005/0107681 A1* | 5/2005 | Griffiths | A61B 5/0046 600/410 |
| 2006/0241384 A1* | 10/2006 | Fisher | A61B 5/0006 600/414 |
| 2010/0066260 A1* | 3/2010 | Newman, Jr. | H05B 33/0845 315/246 |
| 2010/0141158 A1* | 6/2010 | Newman, Jr. | H05B 33/0845 315/182 |
| 2010/0244736 A1* | 9/2010 | Baxter | H05B 33/0809 315/294 |
| 2011/0121744 A1* | 5/2011 | Salvestrini | H05B 33/0815 315/246 |
| 2011/0279032 A1* | 11/2011 | Cartwright | H05B 33/0803 315/85 |
| 2012/0206064 A1* | 8/2012 | Archenhold | H05B 33/0812 315/297 |
| 2012/0286663 A1* | 11/2012 | Puvanakijjakorn | H05B 33/0809 315/85 |
| 2013/0076248 A1* | 3/2013 | Shimizu | H05B 33/0809 315/127 |
| 2013/0221862 A1* | 8/2013 | Knoedgen | H05B 37/02 315/200 R |
| 2014/0159648 A1* | 6/2014 | Sadwick | H02M 1/4266 320/107 |
| 2014/0265935 A1* | 9/2014 | Sadwick | H05B 33/0815 315/307 |
| 2014/0333228 A1* | 11/2014 | Angeles | H05B 33/0815 315/291 |
| 2015/0237693 A1* | 8/2015 | Knoedgen | H05B 33/0815 315/224 |
| 2015/0237695 A1* | 8/2015 | Jelaca | H05B 33/0815 315/291 |
| 2015/0244248 A1* | 8/2015 | Knoedgen | H05B 33/0815 315/223 |
| 2015/0382429 A1* | 12/2015 | Knoedgen | G01R 19/0084 324/414 |
| 2016/0006337 A1* | 1/2016 | Thalheim | H01F 27/2823 363/21.05 |
| 2016/0273722 A1* | 9/2016 | Crenshaw | H02J 7/0021 |
| 2016/0313744 A1* | 10/2016 | Amelio | B64C 27/08 |
| 2017/0223795 A1* | 8/2017 | Sadwick | H05B 33/0815 |

* cited by examiner

MULTI-ZONE LIGHTING SYSTEM AND METHOD INCORPORATING COMPACT RF FEED-THROUGH FILTER FOR MRI SCAN ROOMS

This Application claims the benefit of U.S. Provisional Application No. 62/478,113, filed Mar. 29, 2017.

FIELD OF THE INVENTION

The present invention relates generally to systems and methods of the type that can be electrically energized and used without generating significant amounts of electrical "noise" or electromagnetic interference ("EMI"), also called radio frequency interference ("RFI") when the noise generated is within the radio frequency ("RF") spectrum. The present invention also relates general to electrical systems and methods that include light emitting diode ("LED") light sources, wherein the LED typically comprises a two-lead semiconductor light source. More specifically, the present invention relates to a multi-zone power supply ("MZPS") for use as an off-line LED power supply. The MZPS disclosed herein has linear drive and does not produce EMI, which EMI can generate artifacts in a magnetic resonance imaging ("MRI") scan room, although the present invention can be used in any installation where EMI needs to be reduced.

BACKGROUND OF THE INVENTION

EMI is typically generated by digital signals. This includes pulse width modulation ("PWM"), which emits "noise" that can adversely affect other electronic equipment operating in the vicinity. RF noise is particularly troublesome when it is emitting in an MRI scan room. One single digital signal can "spray" harmonics of the fundamental frequency and emit a full spectrum of RF, both conducted and radiated. This spectrum, ranging from low kilohertz ("kHz") to gigahertz ("GHz") can generate artifacts in the MRI scan image, which is highly undesirable. The artifacts that are generated can seriously impair the quality of the imaging results. Accordingly, it is desirable to avoid generating artifacts within such imaging rooms, including those generated by LED lighting and related controls.

A typical MRI scan room has a pass-through RF filter for each LED light (or "lumenaire") or one RF filter per lighting zone of luminaires. These RF filters require wall space, can be expensive, and limit the flexibility of the MRI lighting system. To save money, a designer might wire all luminaires in parallel and use one large RF filter. One large RF filter is expensive. Such a configuration has other drawbacks as well. For example, if direct current ("DC") luminaires are employed, this requires a bus voltage and this is not optimal for LED lighting. A single DC bus voltage is susceptible to voltage drops on the line as the number of luminaires, and distance between them, is increased. This condition could result in luminares with varying light levels or too much LED drive current. This could also limit the possible lighting zones of the system to one. If AC is used, the luminaire must have an LED driver in the scan room, which would likewise cause EMI while also increasing cost. If the designer wants multiple zones, with a bus voltage, then a RF filter is required for each zone. All of the drawbacks mentioned above still exist, with the multiple zone configuration, and now there will be an additional filter for each lighting zone, thereby further increasing system size and cost.

SUMMARY OF THE INVENTION

For MRI scan room applications, an RF filter is required to reduce EMI for power, or signals, entering the RF shielded room. With the present embodiment, the MZPS is outside the scan room, the filter is on the RF shielded room wall, and the luminaire is in the scan room. The power cables to the lumenaires utilize Power over Ethernet ("POE") technology, which is a technology that lets network cables of certain categories carry electrical power.

The present invention comprises a filter with five or more electrically isolated inputs filtering EMI for configurable lighting systems in an MRI room. In this configuration, this could be considered a multi-zone lighting system of which the MZPS is a part although the MZPS is outside the scan room. The LED driver can be remote or on board the luminaire. The embodiment of the filter includes independent, electrically isolated, low voltage, and low current feedthroughs. While the filter housing can take any form, the preferred embodiment is DB (or D-subminiature which contains two or more rows of pins or sockets surrounded by a D-shaped metal shield that, among other things, screens against EMI). The present invention also comprises a system and method such that individual feedthrough filters may be paralleled to increase total current required for increase load demand for MRI lighting systems. Lastly, the use of electrically isolated AC/DC or DC/DC drive electronics, enable the use of a low cost multi-input filter which supplies an MRI scan room with power to drive luminaires.

The foregoing and other features of the system and method of the present invention will be apparent from the following detailed description when read in conjunction with the accompanying drawings.

DETAILED DESCRIPTION

In accordance with the present invention, these inventors have developed a MZPS which is an off-line LED power supply consisting of twelve independent 700 mA constant current sources capable of supplying an LED luminaire rated at 12 VDC-48 VDC. The regulated output current for each source can be adjusted from 100% to 0.5% of 700 mA with current fold back being linear, such fold back being current limiting in a way that provides some overload protection by reducing the output current limit linearly as output voltage decreases.

Figure 1:
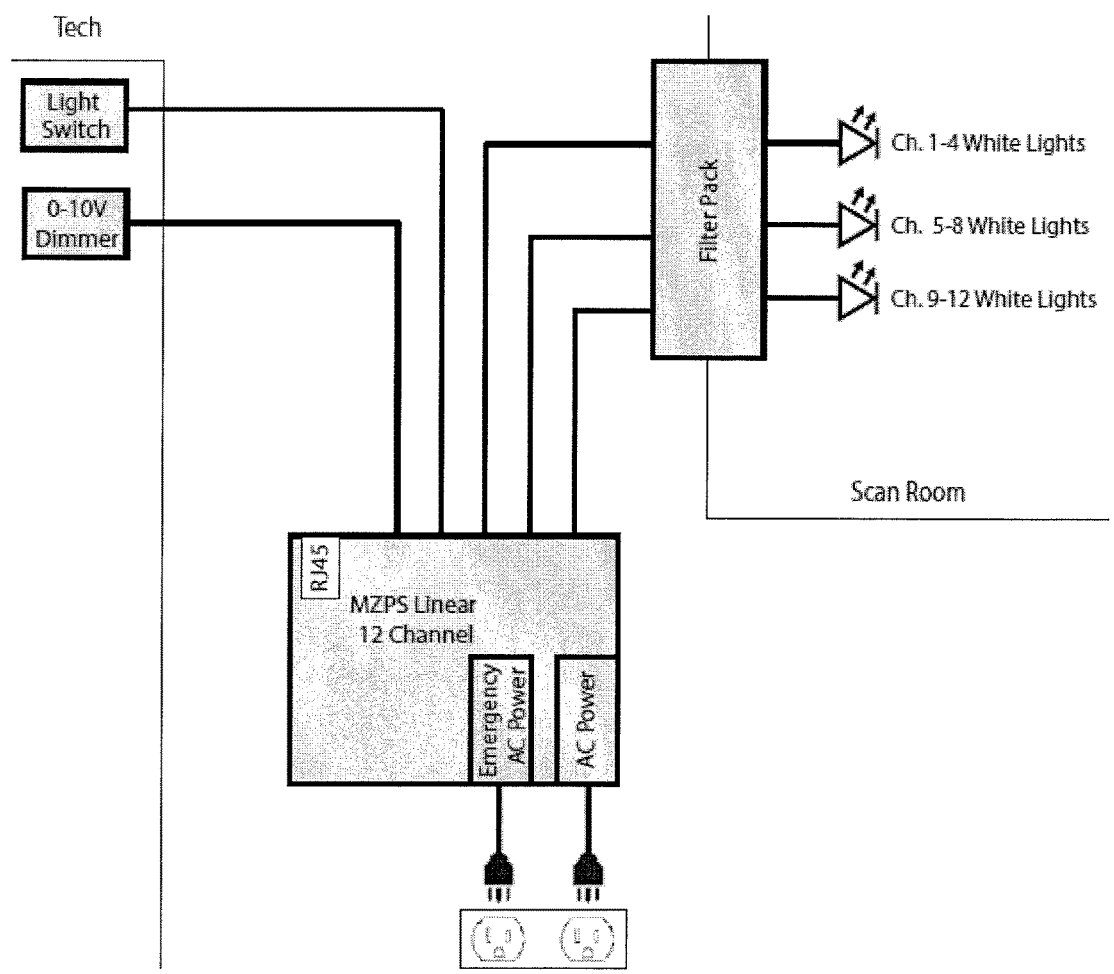
FIG. 1 is a schematic diagram configured in accordance with the present invention.
Figure 2:
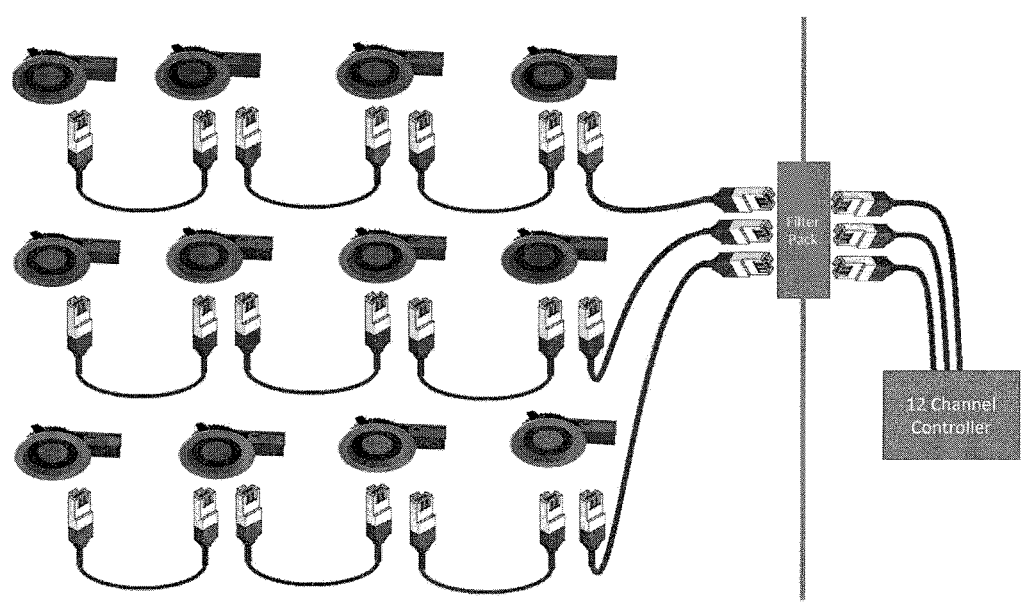
FIG. 2 is a relational diagram showing a luminaire configuration that is configured in accordance with the present invention.

As shown in both FIGS. 1 and 2, the twelve 700 mA outputs are divided into three groups of four and routed from the power supply to the luminaire via Cat5 cable (which is a category 5 cable comprising a twisted pair cable for carrying signals, the balanced line twisted pair design being used for noise reduction), Cat5e cable, Cat6 cable, or any cable using Registered Jack 45 (or "RJ45") connectors, which connectors are most commonly seen with Ethernet cables. Each Cat5 cable consists of four twisted pairs and is terminated on both ends with a RJ45 connector. Each luminaire has an RJ45 input connector and uses one, or multiple, pairs to power the luminaire. In the most basic configuration, this continues until all four Cat5 pairs are used and powers four luminaires. With three groups of four constant current sources, there are three Cat5 cables total per supply which powers up to twelve luminaires. For MRI scan room applications, an RFI filter is required to reduce EMI for power, or signals, entering the RFI shielded room. With the present embodiment, the MZPS is outside the scan room, the filter is on the RFI shielded room wall, and the luminaire is in the scan room. The Cat5 cables are routed from the MZPS, to the filter pack, through the wall and terminated on the luminaire.

Further, the MZPS has a transmission control protocol/internet protocol (or "TCP/IP") interface and can be controlled remotely with a web based application. The MZPS can be programmed to group the twelve 700 mA outputs into various lighting zone configurations. The MZPS can be programmed to have all drivers in one zone, all drivers in separate zones, or any combination in between. When MZPS lighting zones are configured as described herein, they can be saved as a unique setup and recalled by command.

As previously discussed, and for MRI scan room applications in particular, an RF filter is required to reduce EMI for power, or signals, entering the RF shielded room. With the present embodiment, the MZPS is outside the scan room, the filter is on the RF shielded room wall, and the luminaire is in the scan room. The Cat5 cables are routed from the MZPS, to a filter pack, through the wall and terminated on the luminaire.

The proposed system would utilize a small DB9, DB15, or DB25 filter. Because each luminaire is relatively low current smaller integrated filters can be used. One integrated filter, implemented with individual drivers, offers multi-zone lighting configurability. This reduces system cost, ease of installation, and size.

Because of the low current nature of the system a printed circuit board ("PCB"), with surface mount components, could be designed offering an engineer custom filter design at the small price of the PCB layout and an "off the shelf" stamped housing. Also, because each output of the driver is independent, low current, and low voltage the outputs can have a safety listing of UL1310 (Class 2 circuit). This Class 2 rating allows for use of Cat5 cable, eliminates the need for installation by a certified electrician, and enables the integrated low cost/size RF filter feedthrough.

Lastly, it should be noted that the filter presents a reactive load to the power supply so PWM dimming is not used because high dv/dt could make the RLC impedance resonate. The dv/dt device controls voltage spikes generated by adjustable frequency drive, the spike being generally known as reflected wave phenomenon. This resonance can cause uncontrolled oscillations which can cause image artifacts, audible noise, or other undesired effects in an MRI room. Also, the rising edge and square wave nature of PWM can produce harmonics which might cause image artifacts. Therefore, the system only uses linear dimming to avoid the aforementioned issues. That is, the MZPS disclosed herein has constant current LED drive and linear dimming which does not produce EMI. The constant current LED drive allows use of dimmable LED fixtures with no drive circuitry on board and the use of a class 2 constant current driver makes Cat5 wiring, with no conduit, possible.

In view of this disclosure, the foregoing and other features of the present invention are apparent to those skilled in the art.

What is claimed is:

1. A multi-zone power supply, comprising:
    a plurality of current sources, wherein the plurality of current sources is located outside a magnetic resonance imaging (MRI) scan room;
    a plurality of light emitting diodes (LEDs) coupled to the plurality of current sources, wherein the plurality of LEDs are located within the MRI scan room;
    a radio frequency interference (RFI) filter, wherein the RFI filter is located on an interior wall of the MRI scan room; and
    a plurality of cables connecting the plurality of current sources to the plurality of LEDs through the RFI filter.

2. The multi-zone power supply of claim 1, wherein the plurality of current sources are divided into a set of subgroups, wherein each subgroup has an equal number of current sources.

3. The multi-zone power supply of claim 2, wherein the plurality of LEDs are divided into subgroups corresponding to the set of subgroups of the plurality of current sources such that each current source powers one LED of the plurality of the LEDs.

4. The multi-zone power supply of claim 1, wherein the plurality of cables comprise category 5 (cat5) cables.

5. The multi-zone power supply of claim 4, wherein each cat5 cable includes a plurality of connectors such that each cat5 cable is to connect to one subgroup of the set of subgroups of the current sources.

6. The multi-zone power supply of claim 1, wherein each current source of the plurality of current sources is a constant current source.

7. The multi-zone power supply of claim 6, wherein each current source of the plurality of current sources is an adjustable current source such that the output current is changeable.

8. The multi-zone power supply of claim 1, wherein:
    the plurality of current sources are disposed on an outside wall of a scan room;
    the RFI filter is disposed on an inside wall of the scan room; and
    the plurality of LEDs are disposed within the scan room.

9. A multi-zone power supply, comprising:
    a plurality of current sources, wherein:
        each current source of the plurality of current sources is to provide a constant current; and
        the plurality of current sources is located outside a magnetic resonance imaging (MRI) scan room;
    a plurality of light emitting diodes (LEDs) coupled to the plurality of current sources, wherein the plurality of LEDs are located within the MRI scan room;
    a radio frequency interference (RFI) filter, wherein the RFI filter is located on an interior wall of the MRI scan room;
    a plurality of cables connecting the plurality of current sources to the plurality of LEDs through the RFI filter, wherein each cable is a category 5 (cat5) cable; and
    a transmission control protocol/internet protocol (TCP/IP) interface coupled to the plurality of current sources.

10. The multi-zone power supply of claim 9, wherein the RFI filter further comprises a plurality of integrated filters.

11. The multi-zone power supply of claim 10, wherein each of the plurality of integrated filters is located on one of the plurality of LEDs.

12. The multi-zone power supply of claim 9, wherein the TCP/IP interface groups the plurality of current sources into a lighting zone configuration.

13. The multi-zone power supply of claim 12, wherein the lighting zone configuration comprises a uniform zone.

14. The multi-zone power supply of claim 12, wherein the lighting zone configuration comprises each current source of the plurality of current sources having a separate zone.

15. The multi-zone power supply of claim 12, wherein the TCP/IP interface is further to determine an amount of current to supply to each of the plurality of current sources.

16. A multi-zone lighting system, comprising:
a multi-zone power supply;
a plurality of current sources, wherein:
the plurality of current sources are located outside a magnetic resonance imaging (MRI) scan room;
the plurality of current sources are divided into a set of system subgroups; and
each subgroup has an equal number of current sources;
a plurality of light emitting diodes (LEDs) coupled to the plurality of current sources, wherein the plurality of LEDs are located within the MRI scan room;
a radio frequency interference (RFI) filter located on an interior wall of the MRI scan room; and
a plurality of cables connecting the plurality of current sources to the plurality of LEDs through the RFI filter.

17. The multi-zone lighting system of claim 16, wherein the plurality of LEDs are divided into subgroups corresponding to the set of subgroups of the plurality of current sources such that each current source powers one LED of the plurality of LEDs.

18. The multi-zone lighting system of claim 16, wherein the plurality of cables comprise category 5 (cat5) cables.

19. The multi-zone lighting system of claim 18, wherein each cat5 cable includes a plurality of connectors such that each cat5 cable is to connect to one subgroup of the set of subgroups of the current sources.

20. The multi-zone lighting system of claim 16, wherein each current source of the plurality of current sources is a constant current source.

21. The multi-zone lighting system of claim 20, wherein each current source of the plurality of current sources is an adjustable current source such that the output current is changeable.

* * * * *